United States Patent
Chopra et al.

(10) Patent No.: US 7,444,274 B1
(45) Date of Patent: Oct. 28, 2008

(54) METHOD AND SYSTEM FOR VERIFYING CIRCUIT DESIGNS THROUGH PROPAGATION OF ASSERTIONS

(75) Inventors: Manu Chopra, New Delhi (IN); Xiaoqun Du, New Providence, NJ (US); Alok Jain, New Delhi (IN); Robert P. Kurshan, New York, NY (US); Franz Erich Marschner, Ellicott City, MD (US); Kavita Ravi, Chatham, NJ (US)

(73) Assignee: Cadence Design Systems, Inc., San Jose, CA (US)

( * ) Notice: Subject to any disclaimer, the term of this patent is extended or adjusted under 35 U.S.C. 154(b) by 479 days.

(21) Appl. No.: 10/422,389

(22) Filed: Apr. 23, 2003

(51) Int. Cl.
    G06F 17/50 (2006.01)
(52) U.S. Cl. .................. 703/13; 703/14; 716/5
(58) Field of Classification Search ............ 716/5; 703/13, 14
    See application file for complete search history.

(56) References Cited

U.S. PATENT DOCUMENTS

| | | | |
|---|---|---|---|
| 5,418,888 A * | 5/1995 | Alden ............... 706/48 |
| 5,513,124 A | 4/1996 | Trimberger et al. |
| 5,544,066 A | 8/1996 | Rostoker et al. |
| 5,754,826 A | 5/1998 | Gamal et al. |
| 5,778,216 A | 7/1998 | Venkatesh |
| 5,831,869 A | 11/1998 | Ellis et al. |
| 5,901,073 A * | 5/1999 | Kurshan et al. ........ 703/6 |
| 6,018,622 A | 1/2000 | Lin et al. |
| 6,175,946 B1 * | 1/2001 | Ly et al. .............. 716/4 |
| 6,212,669 B1 | 4/2001 | Jain |
| 6,243,849 B1 | 6/2001 | Singh et al. |
| 6,249,902 B1 | 6/2001 | Igusa et al. |
| 6,317,863 B1 | 11/2001 | Segal |
| 6,324,540 B1 | 11/2001 | Khanna et al. |
| 6,415,426 B1 | 7/2002 | Chang et al. |
| 6,480,991 B1 | 11/2002 | Cho et al. |
| 6,493,863 B1 | 12/2002 | Hamada et al. |
| 6,539,523 B1 * | 3/2003 | Narain et al. ........ 716/5 |
| 6,571,375 B1 * | 5/2003 | Narain et al. ........ 716/5 |
| 6,591,231 B1 * | 7/2003 | Kurshan et al. ...... 703/2 |
| 6,591,403 B1 * | 7/2003 | Bass et al. ........... 716/5 |
| 6,609,229 B1 * | 8/2003 | Ly et al. ............. 716/4 |
| 6,651,234 B2 | 11/2003 | Gupta et al. |
| 6,704,912 B2 * | 3/2004 | Narain et al. ........ 716/4 |
| 7,007,249 B2 * | 2/2006 | Ly et al. ............. 716/4 |
| 7,240,316 B2 * | 7/2007 | Regnier ............ 716/11 |
| 2004/0015803 A1 | 1/2004 | Huang et al. |

OTHER PUBLICATIONS

Joseph Richards, Creative Assertion And Constraint Methods For Formal Design Verification, DVCON, Feb. 24, 2003, pp. 1-8.*

(Continued)

*Primary Examiner*—Zoila E. Cabrera
*Assistant Examiner*—Juan C Ochoa
(74) *Attorney, Agent, or Firm*—Vista IP Law Group LLP

(57) ABSTRACT

A method and system for verifying circuit designs through propagation of assertions within a circuit design. In an embodiment, a plurality of provided assertions a circuit design are propagated within the circuit design. The circuit design is then verified using at least one of the propagated assertions as an assumption.

53 Claims, 11 Drawing Sheets

OTHER PUBLICATIONS

Michael Chang and Harry D. Foster, Property Specification: The key to an Assertion-Based Verification Platform, Jan. 2003, pp. 1-7.*

Kurshan, Robert P., "Computer-Aided Verification of Coordinating Processes, The Automata Theoretic Approach", Princeton University Press, NJ, 1994.

Venkatesh, S.V., "Hierarchical Timing-Driven Floorplanning and Place and Route Using Timing Budgeter" *IEEE 1995 Custom Integrated Circuits Conference* (1995) pp. 469-472.

Hadley, S.W. et al. "An Efficient Eigenvector Approach for Finding Netlist Partitions" IEEE Transactions on Computer-Aided Design (Jul. 1992) 11(7):885-892.

Huang, W.C. et al. "A Hierarchical Partitioning Algorithm for VLSI Designs" Proceedings of the IEEE International Systems-on-Chip Conference (Sep. 17-20, 2003) pp. 265-266.

Vanelli, A. and S.W. Hadley "A Gomory-Hu Cut Tree Representation of a Netlist Partitioning Problem" IEEE Transactions on Circuits and Systems (Sep. 1990) 37(9):1133-1139.

IBM "Timing-influenced layout design" *IBM Technical Disclosure Bulletin* (Apr. 1986) 28(11):4981-4987.

Marques-Silva, J. and L.G. Silva "Solving satisfiability in combinational circuits" *IEEE Transactions* (Jul.-Aug. 2003) 21:505-516.

Sulimma, K. et al. "Improving placement under the constant delay model" *Design, Automation and Test in Europe Conference and Exhibitions* (Mar. 2003) pp. 677-682.

* cited by examiner

METHOD AND SYSTEM FOR VERIFYING CIRCUIT DESIGNS THROUGH PROPAGATION OF ASSERTIONS

BACKGROUND AND SUMMARY

The present invention is related to verification of circuit designs. More particularly, the present invention is directed to a method and system for verifying circuit designs through propagation of assertions.

Circuit designers and verification engineers use different methods to verify circuit designs. One common method of verification is the use of simulation. Simulation dynamically verifies a design by monitoring behaviors of the design with respect to simulation test benches. Another method of verification is the use of model checking. Model checking statically verifies properties of a design by analyzing the state space of the design and determining whether a property holds in all reachable states. The properties to verify may be global properties involving signals in widely separated parts of the design, or they may be more local properties that pertain only to single or small number of related modules in the design.

As used herein, the term "module" refers to any part of an integrated circuit design. A module may comprise, for example, one or more functional components or a part of each of one or more functional components. A module is generally parameterized and thus may be instantiated one or more times in an integrated circuit design to describe "instances" of that module. An integrated circuit design in this case is comprised of module instances.

Model checking has potential advantages over simulation. For example, no simulation test bench is required to run model checking. Additionally, model checking, unlike simulation, is exhaustive. On the other hand, model checking, due to computational limitations, generally cannot handle large designs. Hence, designs must often be partitioned into sufficiently small parts in order to model check a given property. Although presently capacity is not an issue for simulation of designs, it is foreseeable that in the future, designs could be of a size that cannot be handled by a simulator as a whole. Model checking is also sensitive to assumptions about the environment of the portion of the design being checked, and is prone to generating false negatives, i.e., reports of failures that cannot actually happen, if sufficient information about the environment is not included in the run.

Properties of a circuit design can be embedded in the design in the form of assertions, i.e., statements that describe expected design behavior. Assertions can be entered by the circuit designer or added by a separate process. These assertions, which relate to either local or global properties, can be used to verify a design using dynamic and/or static techniques. When a simulator is applied to the design, the assertions can be extracted as part of a test bench and used in checking the circuit for assertion violations. When model checking is applied to the design, an assertion can serve as the basis for what is checked.

For model checking of global properties, in which the signals involved may be widely distributed within the design, partitioning is typically driven by data dependencies. For example, COSPAN (Coordination Specification Analysis), a well-established verification system developed by Bell Laboratories in the mid-1980s, uses a method called iterative reduction to focus verification on just the portion of the design required. This method incrementally adds in more and more of the design's behavior in an attempt to eliminate negative results. Because this approach is automatic and follows data dependencies, the boundary of the behavioral region being considered may not be obvious to the user, and it may not coincide with natural boundaries in the design. Additionally, this approach requires having the entire design available in memory, so that incremental portions can be pulled in as needed. Further details regarding this method is disclosed in U.S. Pat. No. 5,691,925, which is hereby incorporated by reference in its entirety.

A different approach may be taken for local property checking as the local properties only apply to a restricted portion of the design. Partitioning for model checking local properties can first be done along module or instance boundaries so that only a portion of the design need be in memory for a given verification run. Such partitions would also follow the natural partitioning present in the design hierarchy, and would be easy for designers and verification engineers to understand. Further details regarding partitioning of a circuit design is disclosed in co-pending U.S. application Ser. No. 10/422,535, filed on Apr. 23, 2003, which is hereby incorporated by reference in its entirety. However, there is still a need for appropriate constraints on the environment of each such partition, in order to avoid false negatives.

Consider a single module of a design, containing embedded assertions. If one of the embedded assertions is strictly dependent upon input ports of the module, or strictly dependent upon outputs of a subordinate instance, then that assertion cannot be checked in the context of the module alone; however, it can be interpreted as an environmental constraint and used as an assumption when checking other assertions in the module. That assertion must be checked in another, or a larger, context, in which the logic driving the signals involved in the assertion is available. This implies that assertions that have been embedded elsewhere, and can be checked in that other context, could potentially be used as assumptions in this module, if they constrain signals that drive inputs to this module.

Thus, instead of incrementally extending a partition to include more behavior that might be necessary to verify a given assertion, the assertions can be proactively redistributed in a design to create local copies in each potential partition, so that any remote assertions likely to be useful as assumptions in a given partition are locally available in each possible partition. Since the assertions in a design are likely to be more concise and focused than the design itself, this approach could be quite effective, provided that enough properties are embedded in the design to capture all the significant behavior of the design.

Several issues need to be considered when propagating assertions in this manner. Since each module in a design may be instantiated many times, and may instantiate other modules many times, there is a need to manage the potential multiplication of assertions when propagating an assertion from a module to the context of each instance of that module or to each module instantiated in that module. Detecting any conflict among propagated assertions and checking for compatibility between propagated assertions (e.g., clock information) and that specified by the user, when both are present, are some other issues that need to be considered.

A further issue that should be considered is the need to avoid circular reasoning, i.e., where an assumption is directly or indirectly used to prove itself. For example, if an assertion A is assumed to be true in order to verify an assertion B, then it would be logically unsound to in addition, assume B to be true in order to verify A. One way to avoid circular reasoning is to check for cycles in the inference tree, and bar any assumption that would close a cycle. For example, in the above example, having used A to verify B, an attempt to then use B to verify A would be barred because A→B→A would close a cycle in the inference tree.

One drawback of the above method is that it is not reproducible if the verification process is started in a different place. For example, the verification process may start with A and verify B using A. At another time, the verification process may start with B and verify A using B. Suppose that A is also verifiable in its own right (without any assumptions), but that fact was not known when B was used to verify A. In the first case, B may be verified using A and then all that's left is to verify A in its own right. If this succeeds, both A and B are verified. In the second case, A is verified using B, and thus A cannot be used to verify B. In this case, if B is not verifiable in its own right, A is conditionally verified and B is unverified. It may be unacceptable to get different verification results for the same design, depending on where in the design the verification process initiates.

The present invention provides a method and system for verifying circuit designs through propagation of assertions. In an embodiment, a plurality of assertions in a circuit design are propagated within the design. The circuit design is then verified using at least one of the propagated assertions as an assumption.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

The accompanying drawings are included to provide a further understanding of the invention and, together with the Detailed Description, serve to explain the principles of the invention.

DETAILED DESCRIPTION

Figure 1:
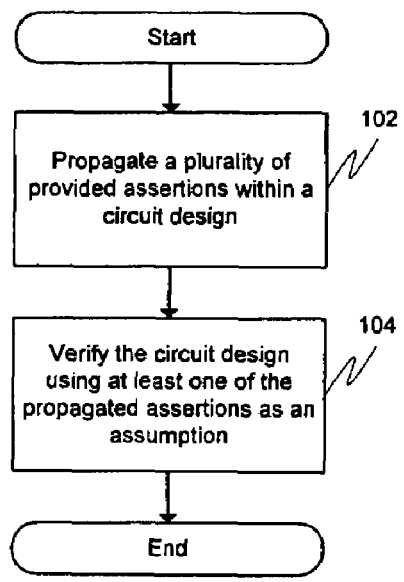
FIG. 1 depicts a process flow chart of an embodiment of the present invention.

The present invention provides a method and system for verifying circuit designs through propagation of one or more assertions within a design. FIG. 1 is a flowchart of a method for verifying a circuit design according to an embodiment of the invention. In this embodiment, a plurality of provided assertions are propagated within a circuit design (102). The circuit design is then verified using at least one of the propagated assertions as an assumption (104).

Figure 2:
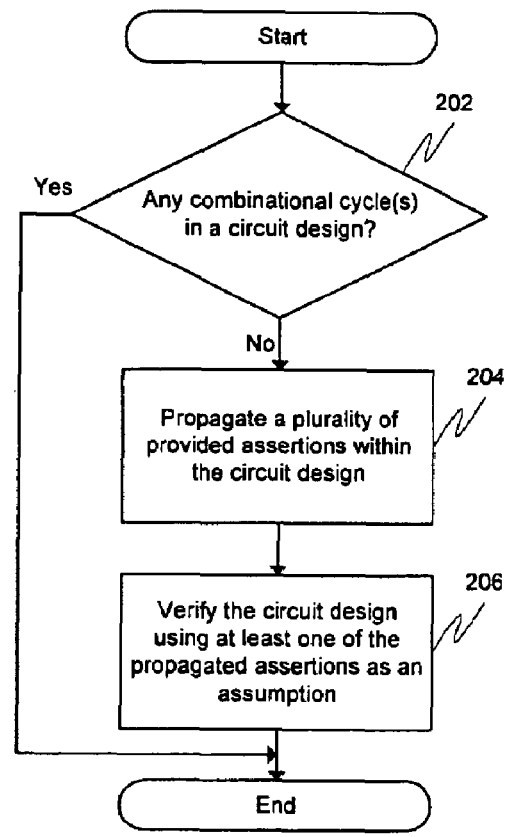
FIG. 2 shows a flow diagram of a method for verifying a circuit design according to one embodiment of the present invention.

A design is represented as a collection of assignments to a set of variables, some of which are state variables and some of which are combinational variables. In one embodiment of the invention, it is assumed that no combinational cycles exist in the design. Referring to FIG. 2, a flow diagram of a process for verifying a circuit design according to another embodiment of the invention is illustrated. In this embodiment, a determination is made as to whether there are any combinational cycles in a circuit design (202). If no combinational cycles are found, a plurality of provided assertions are propagated within the circuit design (204). The circuit design is then verified using at least one of the propagated assertions as an assumption (206). If a combinational cycle is found, the verification process ends. In a further embodiment, rather than terminating the verification process when combinational cycles are found, the combinational cycles are simply removed from the circuit design and the verification process continues.

Figure 3:
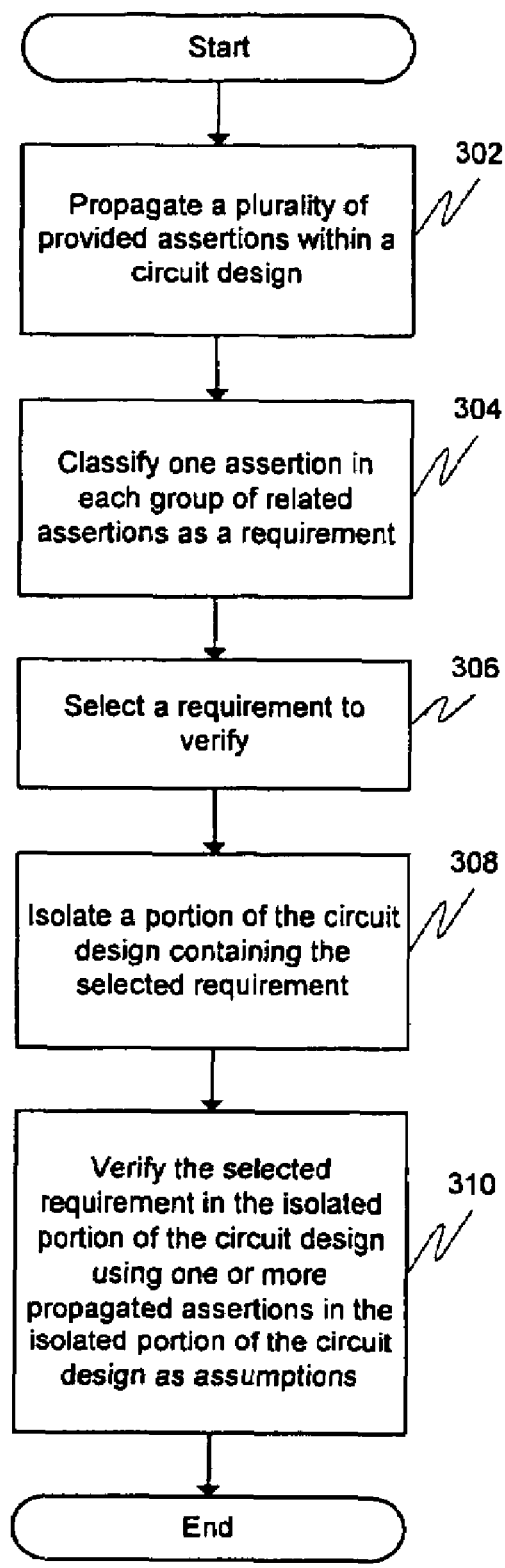
FIG. 3 depicts a flow chart of a process for verifying a circuit design according to another embodiment of the present invention.

FIG. 3 illustrates a flow chart of a method for verifying a circuit design according to one embodiment of the invention. In this embodiment, a plurality of provided assertions are propagated within a circuit design (302). One assertion in each group of related assertions is classified as a requirement (304). In an embodiment, two assertions are related when the two assertions are propagated from the same provided assertion or when one assertion is propagated from another assertion. A requirement is selected to be verified (306). A portion of the circuit design containing the selected requirement is isolated (308). The selected requirement is verified in the isolated portion of the circuit design using one or more propagated assertions in the isolated portion of the circuit design as assumptions (310).

In an embodiment, let a combinational variable y be assigned in terms of an expression f(X) for a vector X of other combinational variables: $y:=f(X)$. The (1-step) backward propagation of y is the expression f(X). If x is a scalar and f is invertible, so $x=f^1(y)$, then the (1-step) forward propagation of x is the expression $f^1(y)$. The 0-step propagation of a variable is that variable.

A backward propagation (resp., forward propagation) of a variable is a succession of any number of such propagation steps, in which the variable is replaced by its propagation in each step, and the resulting variables are, in succession, propagated iteratively. The propagated image of an expression in terms of combinational variables is an expression resulting from replacing each variable of that expression with some (0 or more step) propagation of that variable. The backward (resp., forward) propagation of an expression is the expression resulting from propagating each variable of the expression in the designated manner.

In one embodiment, an expression propagates across a module instance boundary if it propagates to an expression that is in terms of variables, all of which are either in the parent of the module instance in which the variables of the original expression were declared, or are in a single child module of the module in which the variables of the original expression were declared.

In another embodiment, an assertion propagates across a module boundary if all the expressions in all its conditions (enabling/fulfilling/discharging) do. The result is the propagated image of the property. The property is said to propagate forward (resp., backward) across a module boundary if it propagates across the module boundary, and its fulfilling condition propagates forward (resp., backward) across the boundary.

A design hierarchy is a tree where the root of the tree is the top module of the design hierarchy and each node in the tree corresponds to a module instance in the design hierarchy. The tree is conceptualized with the root at the top and the leaves at the bottom. The notions of "up" and "down" follow accordingly.

A hierarchy node is the pathname of a module instance, starting from the snapshot root, e.g., A.B.C where A is the "top" module. The depth d of a hierarchy node is the number of instance names it contains, e.g. d(A.B.C)=3.

Each assertion is propagated forward and/or backward, across a succession of module boundaries. Note that propagation in either single direction may result in repeated changes in "up/down" direction, relative to the design hierarchy.

In an embodiment, for each assertion p, define its assertion graph $G_p=(V_{Gp}, E_{Gp})$ to be the directed graph whose nodes are all propagated images of p, with an edge (q,r) if q is a backward propagation of r, or if r is a forward propagation of q. In one embodiment, for an assertion p, a consecutive sequence of images of p is a set of nodes S in $G_p$, such that for any two nodes s1, s2 in S, s1 can be derived from propagating s2 without crossing any module boundaries.

In one embodiment, it is assumed that there is some rule that enforces:
  a) No propagated image spans two module instances (i.e., the expressions in a propagated assertion only refer to variables in one module);
  b) At most one image of p is recorded in each consecutive sequence of images of p.

The above rule serves to simplify the implementation. One method of implementing a) is to eliminate all violators. A way to implement b) is to propagate backward and forward to module inputs and outputs. Then preserve the image on the inputs if there is one, otherwise propagate backward as far as possible.

In one embodiment, $G_p$ is a directed acyclic graph (DAG), with a unique source. This relies on assumptions a and b, specified above. For each p, let $R_p$ in $V_{Gp}$ be the source of $G_p$. $R_p$ is a requirement to be verified; all other images of $R_p$ in $V_{Gp}$ are assertions that can be used as assumptions in proving other requirements.

Let $$V = \bigcup_P (V_{Gp})$$

If v, w are nodes in V, write "v~w" to mean that there is some p such that v, w in $V_{Gp}$. In another embodiment, if v~w then v is true on the design if w is. Say an assertion p is an environmental constraint if the fulfilling condition of $R_p$ is expressed in terms of primary inputs of the design.

Every design takes inputs from its "environment" in which said design is expected to operate. Normally, there are posited some constraints on the behavior of this environment, governing the nature of the inputs it will provide. These constraints, called "environmental constraints," cannot be verified on the design under verification, since they refer to mechanisms outside that design. Assertions that define global control signals (e.g., clock or reset) are examples of environmental constraints. These are used as constraints only.

A strategy for verifying each assertion p in the design (except for environmental constraints) is to verify $R_p$. This will prove that p is true according to the embodiment where if v~w then v is true one the design if w is. However, in order to prevent circular reasoning, only certain assertions will be used as assumptions to verify other assertions. The following is a way of using propagated assertions according to one embodiment of the invention, whose purpose it is to provide a reproducible verification result that is independent of where, i.e., with which assertions, the verification process begins.

Let A be the set of assertions to be considered, and let $R=\{R_p | p$ in $A$ and $p$ is not an environmental constraint$\}$.

Let $C_E$ be the set of environmental constraints.

For verifying requirements, constraints are selected for use as assumptions according to one of the two rules stated below.

For each assertion p that is not an environmental constraint, let $$C_p+=\{v \in V_{Gp} | d(v)<d(R_p)\}$$

$$C_p-=\{v \in V_{Gp} | d(v)>d(R_p)\}$$

$$C+=\bigcup_P C_p+$$

$$C-=\bigcup_P C_p-$$

Notice that $C_p+$ and $C_p-$ include only constraints; $R_p$ is excluded by the depth restriction. In another embodiment, requirements not being verified can be used as assumptions in the verification of other requirements.

Define:

UP-Rule: to check a requirement r, use $\{c | (c \in C_E)$ or $(c \in C+$ and $d(c)>=d(r))\}$;

DOWN-Rule: to check a requirement r, use $\{c | (c \in C_E)$ or $(c \in C-$ and $d(c)<=d(r))\}$.

Since both the UP-Rule and the DOWN-Rule are sound, either rule can be used in verification. However, one rule should be selected and used consistently for verifying all requirements in a design. In an embodiment, for a given design, the rule that makes available the larger set of constraints is used on the assumption that "the more constraints, the more one can verify and the faster one can check". For example, let the size of C+ (resp. C-) be the number of constraints in that set. If the size of C+ is larger than that of C−, then the UP-Rule is used. Otherwise, the DOWN-Rule is used. Selection of which rule to use may also be influenced by the location of requirements to verify within the design. With UP-Rule, the requirements at the root of the design can only use environmental constraints. With DOWN-Rule, all requirements at the leaf nodes of the design can use only environmental constraints.

Figure 4:
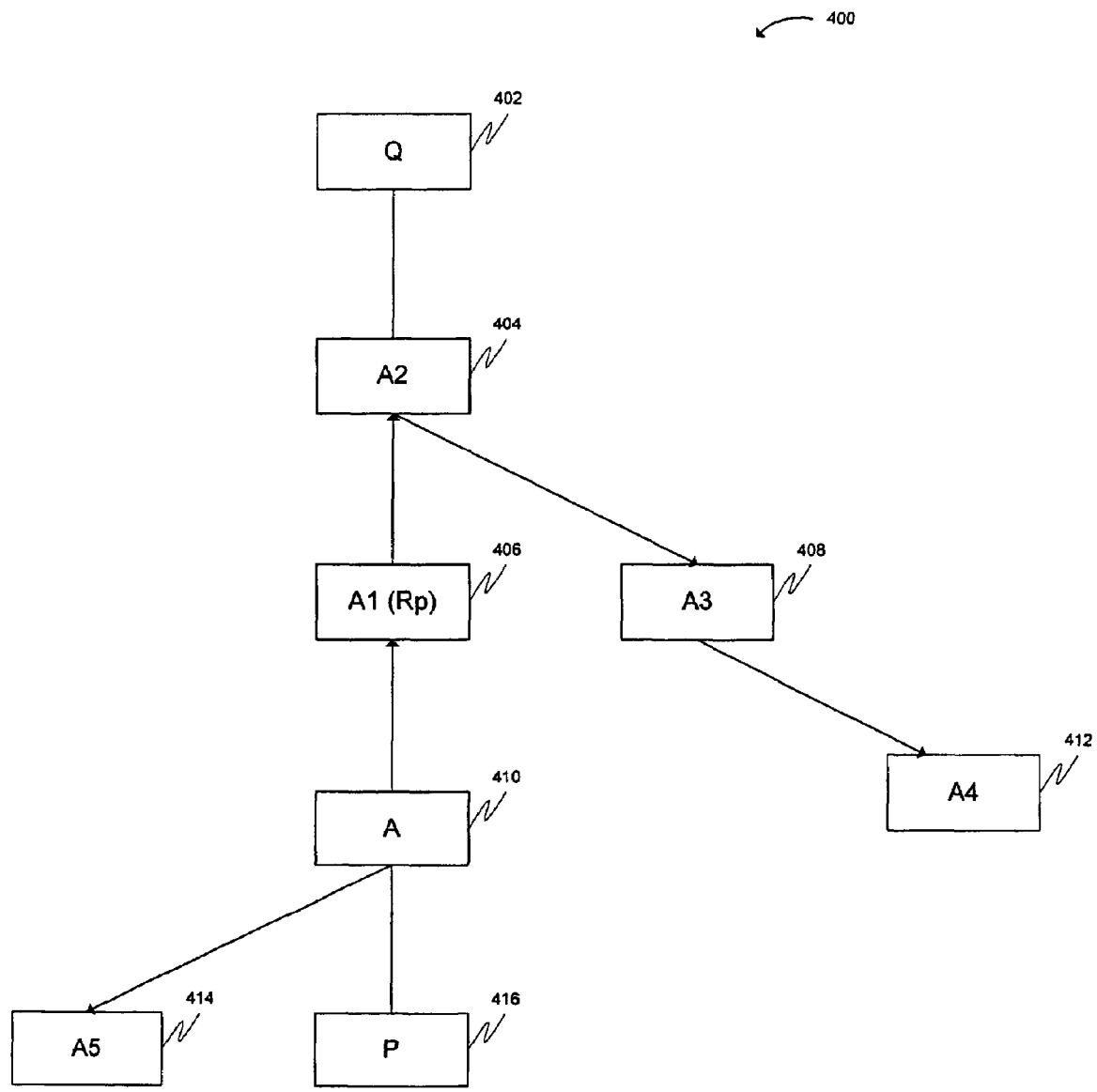
FIG. 4 is an assertion graph according to an embodiment of the present invention.

FIG. 4 illustrates an assertion graph 400 according to an embodiment of the invention. There are six images of assertion A 404-414 in assertion graph 400 along with two requirements P 416 and Q 402. Assertion graph 400 shows the hierarchy of the assertion images. Image A1 406 has been classified as the requirement $R_p$ to be verified for assertion A 410. Thus, images A 410, A2 404, A3 408, A4 412, and A5 414 will be used as constraints. In an alternative embodiment, the root image of an assertion, e.g., the assertion entered by the designer, is classified as the requirement $R_p$. In a further embodiment, the most upstream image of an assertion is classified as the requirement $R_p$. If the UP-Rule is selected, constraint A2 404 can be used as an assumption to prove Q 402 because A2's 404 depth is less than the depth of $R_p$ 406 but greater than or equal to the depth of Q 402. If the DOWN-Rule is selected, constraints A 410 and A5 414 can be used as assumptions to prove P 416 because the depths of A 410 and A5 414 are greater than the depth of $R_p$ 406 but less than or equal to the depth of P 416.

Figure 5:
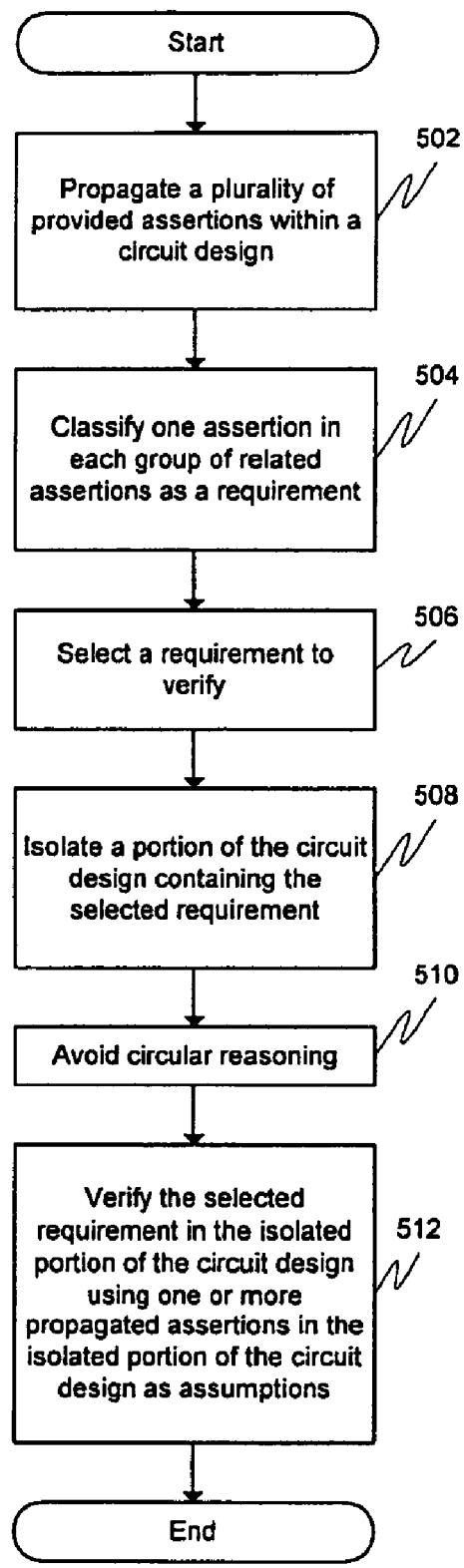
FIG. 5 shows a process flow chart of a method for verifying a circuit design according to one embodiment of the present invention.
Figure 6:
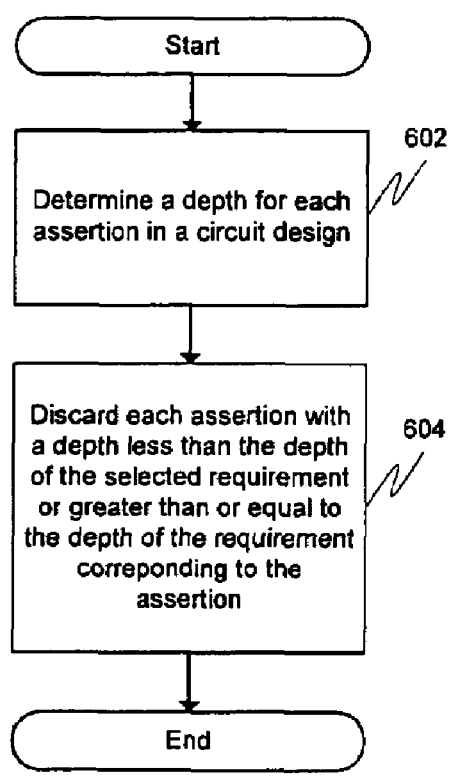
FIG. 6 depicts a flow diagram of a method for avoiding circular reasoning according to an embodiment of the present invention.
Figure 7:
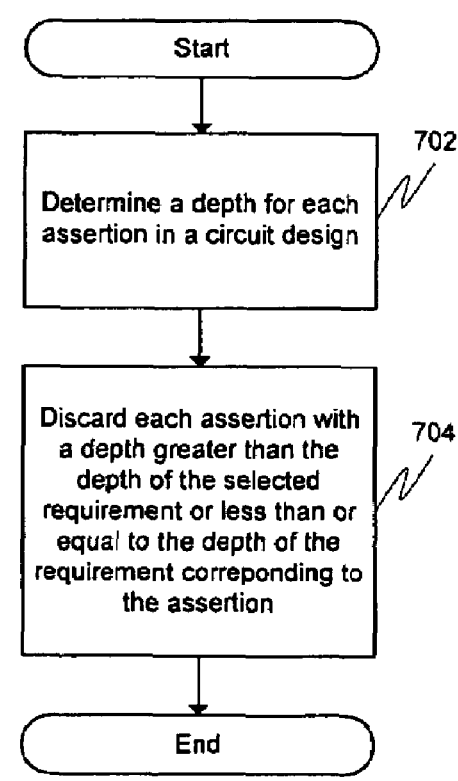
FIG. 7 is a flow chart of a process for avoiding circular reasoning according to another embodiment of the present invention.

FIG. 5 depicts a process flow of a method for verifying a circuit design according to one embodiment of the invention. In this embodiment, in addition to the steps discussed above with respect to FIG. 3, circular reasoning is avoided at step 510. FIG. 6 illustrates a method of avoiding circular reasoning according to an embodiment of the invention. A depth for each assertion in the circuit design is determined (602). Each assertion with a depth less than the depth of the selected requirement or greater than or equal to the depth of the requirement corresponding to the assertion is discarded (604). FIG. 7 shows a flow chart of a method of avoiding circular reasoning according to another embodiment of the invention. In this embodiment, each assertion with a depth greater than the depth of the selected requirement or less than or equal to the depth of the requirement corresponding to the assertion is discarded (704).

One implementation of assertion propagation would involve operating on a representation of the entire design. There are several disadvantages to such an approach. One disadvantage is that this would involve keeping the entire design representation in memory all at once, and accessing it with minimal locality of reference, which together would create both capacity and performance problems. Another disadvantage is that if an assertion is embedded in a given module, and there are many instances of that module in the design, this approach may lead to much redundant effort to propagate different instances of the same assertions (e.g., in replicated sub-trees within the design).

An alternative approach would be to focus on the module definitions rather than the full instance tree. This would minimize memory requirements and increase locality of reference as only one module need to be accessed at a time. It would also avoid redundant propagation of assertions where possible.

Figure 8:
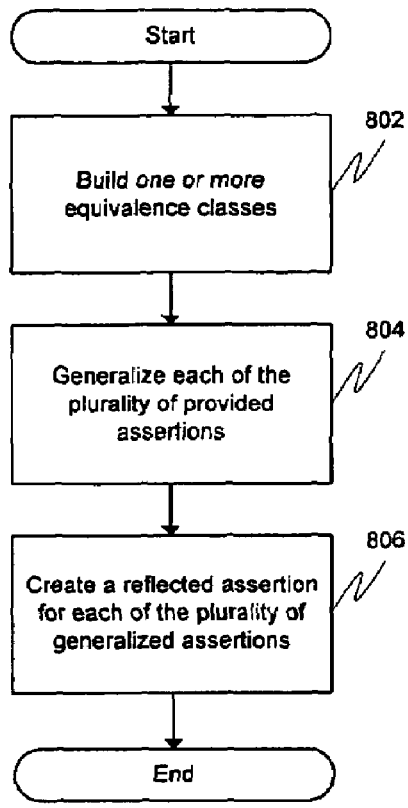
FIG. 8 illustrates a flow diagram of a process for propagating assertions according to one embodiment of the present invention.

An embodiment of the approach is illustrated in FIG. 8 and discussed below. The embodiment addresses assertion propagation through identity or inversion assignments, i.e., the function f defined above is the identity or inversion function. To support the full generality of the definition of propagation given above, the approach is generalized to handle assignments that involve more complex functions (i.e., general expressions).

One idea of the embodiment is to identify equivalence classes of signals that represent identical or inverted values. The fact that two signals refer to identical or inverted values is deduced syntactically from the assignments of these signals. Any assertion that refers to a given set of signals could be recast as an assertion about equivalent signals in corresponding equivalence classes. For the most part, computation is linear with respect to the number of module and assertion definitions, except where downward propagation of assertions result in different sets of propagated assertions for different instances of the same module. However, the additional cost in this case is still likely to be smaller than the cost of propagation within the fully elaborated instance tree.

In the embodiment, it is assumed that the process is operating on a representation of the design source code that has been transformed to implement the single assignment assumption and has been checked to confirm that it meets the no combinational cycles assumption.

Referring to FIG. 8, a flow diagram showing a process for propagating assertions according to one embodiment of the invention is illustrated. At step 802, equivalence classes are built. For each module (definition) in the DAG of module dependencies, bottom-up through the DAG by doing the following:

1a. For each signal in the module, create an equivalence class containing that signal. Mark the variable as both a 'source' and a 'localsource', and also mark it as 'phase'=0 to show that it is not inverted with respect to its source. (The $R_p$ image of a given assertion will be constructed based on the presence of 'source' marks. The other images of an assertion p in $G_p$ will be constructed based on the presence of 'localsource' marks.)

1b. For each direct or inverted assignment (or equivalent) in the module, merge the equivalence classes of the LHS and RHS signals. If the assignment is inverting, then invert the 'phase' mark (change 0 to 1, 1 to 0) of each signal in the equivalence class of the LHS signal. Mark the LHS signal itself as neither a 'source' nor a 'localsource'.

1c. For each signal S that is associated with a port P of an instance I of subordinate module M in this module, get the equivalence class for M.P, make a copy, prefix each signal in the copy with the name "I:M." (to uniquify those signals), and merge the copied equivalence class into the equivalence class for S, as in (2) above. If M.P is an input port, then mark M.P in the merged equivalence class as not a 'source'. If M.P is an output port, then mark S as not a 'source'. Leave the 'localsource' marks unchanged.

When the above steps are completed, there will be a set of equivalence classes for the entire design, each of which contains a set of signals that have the same or inverted values in various places in the hierarchy. Each equivalence class represents an independent 'tree' of signals, such as a clock tree. The 'phase' mark on each signal shows whether it is inverted or not with respect to the source of the signal tree. The 'source' mark uniquely identifies the ultimate driver of the tree. The 'localsource' mark identifies the most "upstream" signal in the tree in any given module definition (or instance—same in all instances).

At step 804, each assertion is generalized. For each module (definition) in the DAG, in whatever order, do the following:

2a. For each assertion definition, make a copy of the assertion and replace each reference to a signal with a reference to the (unique) equivalence class in which that signal appears. Call this 'generalized assertion'.

When the above step is done, there will be a set of generalized assertions for the whole design. At step 806, reflected assertions are created. For each generalized assertion, do the following:

3a. For each equivalence class referenced by the generalized assertion, find the set of pathname prefixes (of the form "I1:M1.I2:M2 ... In:Mn") of signals in that equivalence class.

3b. Take the intersection of these sets of pathname prefixes (one for each equivalence class referenced by the generalized assertion). Call the result the "common prefix set".

3c. For each unique pathname prefix P in the common prefix set, create an assertion reflection instance, as follows:

Create a copy of the generalized assertion.

For each equivalence class referenced by the copy of the generalized assertion, find the signal SL prefixed by P and marked as a 'localsource' in that equivalence class, remove the pathname prefix P, and replace the reference to the equivalence class in the copy of the generalized assertion with a reference to the (un-prefixed) SL, negated if its 'phase'=1. Call this the reflected assertion' ($R_a$) for pathname prefix P.

Locate the module that is the module type of the final part of prefix P and associate the tuple (P, $R_a$) with that module definition.

If no signal in the reflected assertion $R_a$ is marked as a 'source', then mark the reflected assertion as a constraint; otherwise if any signal in the reflected assertion refers to a primary input of the design, then mark the reflected assertion as an environmental constraint; otherwise mark the reflected assertion $R_a$ as a requirement ($R_p$).

When the above steps are done, for each original assertion there should be a reflection of that assertion in every module where the assertion could be propagated by replacing each signal it references with a (possibly negated) reference to another signal in the same equivalence class, in each case, the reflected assertion will be expressed in terms of the 'most upstream' equivalent signals in the module to which it has been reflected. In one embodiment, the image of the assertion that is 'most upstream' within the whole design will be marked as a requirement to check ($R_p$), those requirements that are environmental constraints will be so marked, and all other images will be marked as constraints. (Note that the original assertion is then irrelevant.) In another embodiment, each reflected assertion will be attached to a module definition together with the instance path for the instance(s) of that module definition to which it applies.

Assertion propagation may result in creating multiple copies of the same assertion in a given module. Where this occurs and can be detected easily (e.g., through syntactic comparison), it is reasonable to merge the multiple copies into a single copy, in order to minimize storage requirements.

Figure 9:
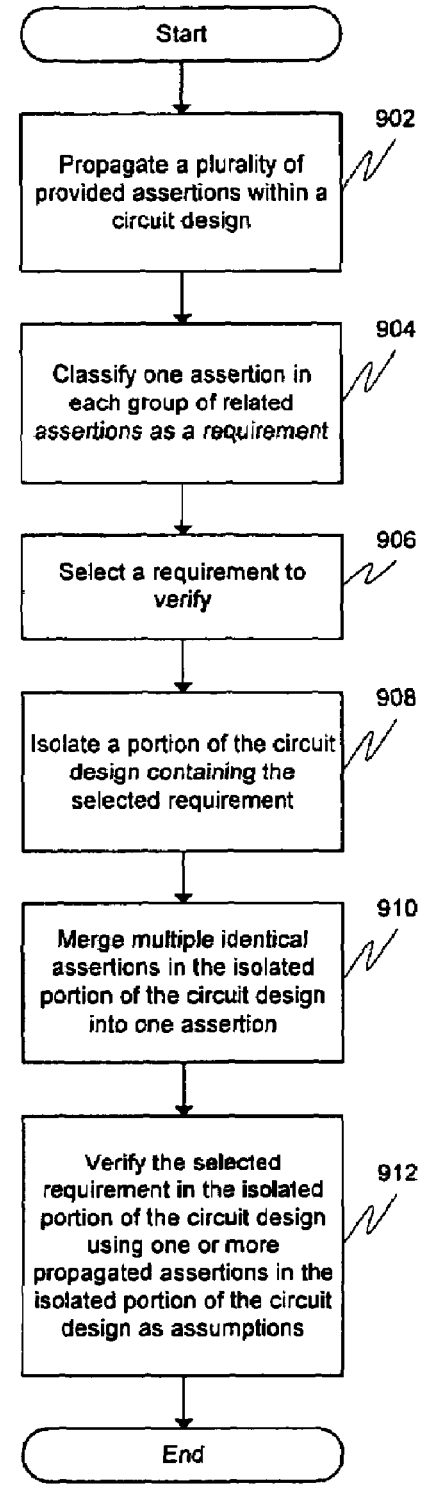
FIG. 9 depicts a process flow chart of a method for verifying a circuit design according to an embodiment of the present invention.

Referring to FIG. 9, a flow diagram of a process for verifying a design according to one embodiment of the invention is shown. In addition to the steps discussed above in reference to FIG. 3, identical assertions in the isolated portion of the circuit design are merged into one assertion (910).

Figure 10:
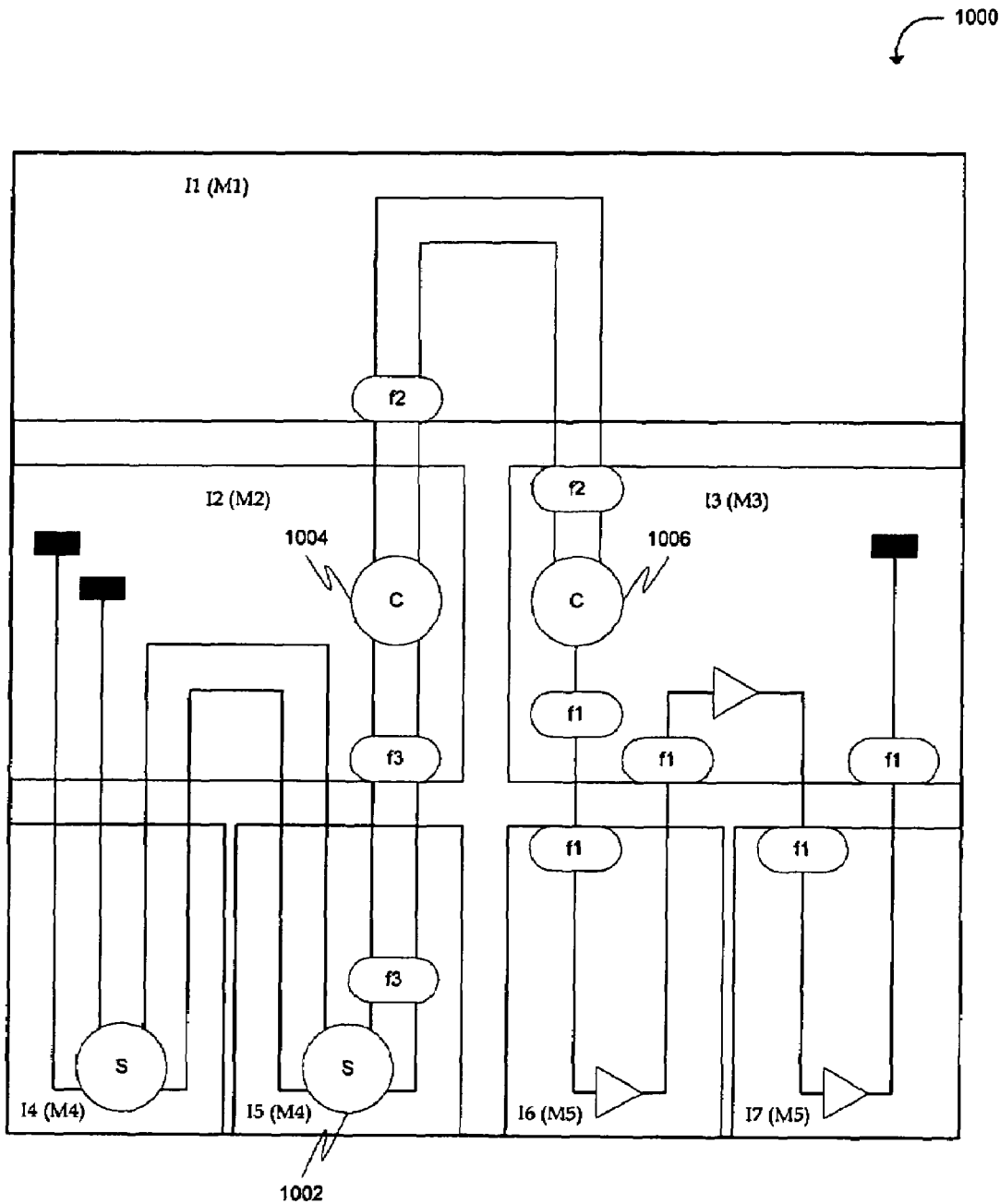
FIG. 10 illustrates a circuit according to one embodiment of the present invention.

In one embodiment, two assertions are identical if each assertion has been propagated through identical logic. For example, in FIG. 10, a circuit 1000 is illustrated. Circuit 1000 comprises five modules M1-M5 and seven module instances I1-I7. Assertion f has been propagated within circuit 1000. In this embodiment, assertions are not propagated through sequential logic. For example, in module instance I5, assertion f is not propagated through sequential logic 1002. In contrast, in module instance I2, assertion f is propagated through combinational logic 1004. Although there are nine assertions in circuit 1000, only three of those are unique. For example, assertion f1 in module instance I3 is transformed into assertion f2 when it is propagated through logic 1006. Thus, in one embodiment, assertions f1 and f2 would not be merged into a single assertion as they are not identical. In contrast, since module instance I3 has multiple copies of assertion f1, those copies would be merged into a single assertion.

It is also possible that propagated assertions can conflict. In one embodiment, situations in which assertions in different parts of the design are logically inconsistent are detected early in the process, because this indicates that an error exists in the specification. A logical vacuity check is sufficient to detect conflict in most cases. Assertions about clocks, however, require special handling. Clock assertions specify the sequence of values taken on by the collection of clocks involved in the clocking scheme. A clock assertion at one level of the design hierarchy may involve multiple clock signals, whereas a clock assertion at a lower level in the hierarchy may involve only a single clock signal. Two clock assertions conflict only if there is no way in which one can be subsumed by the other. Because in general clock assertions do not have a common temporal reference point (i.e., a common base clock), checking for compatibility between two clock assertions involves more than a simple vacuity check.

Figure 11:
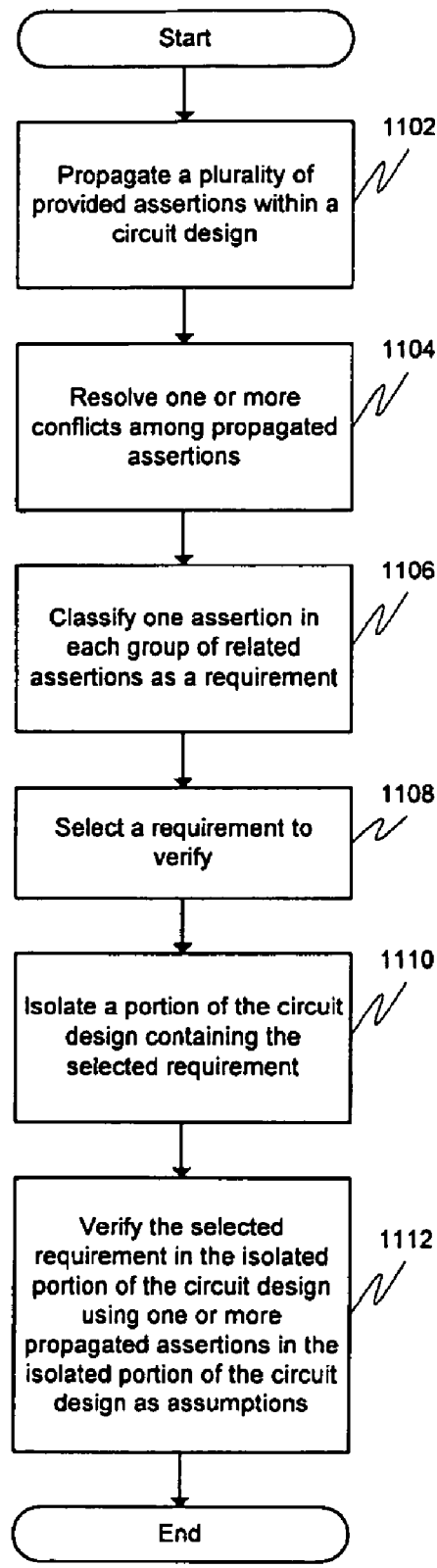
FIG. 11 shows a flow diagram of a method for verifying a circuit design according to another embodiment of the present invention.

Referring to FIG. 11, a flow chart of a method for verifying a circuit design according to one embodiment of the invention is illustrated. In addition to the steps discussed with respect to FIG. 3, at step 704 one or more conflicts among propagated assertions are resolved.

Figure 12:
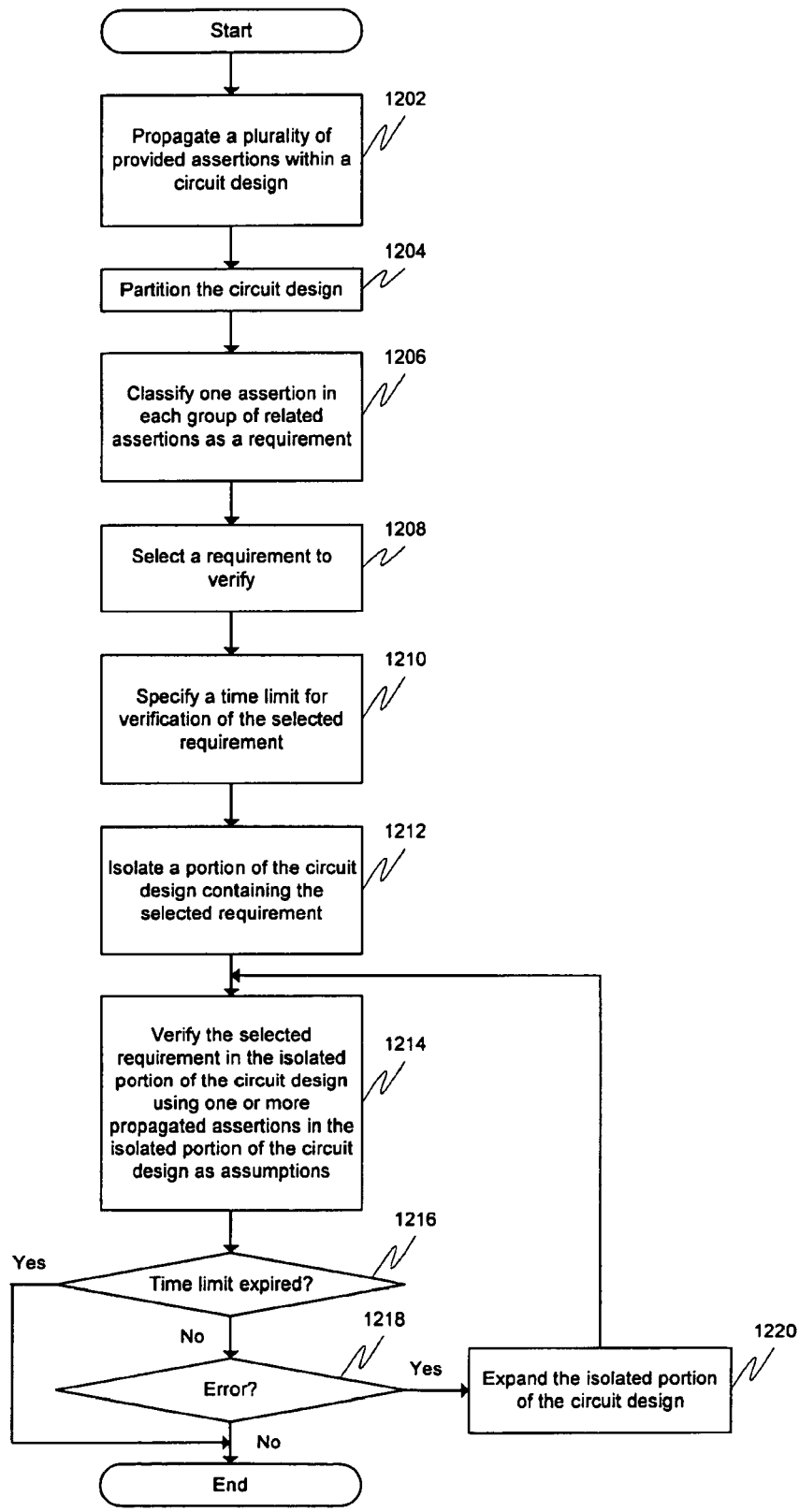
FIG. 12 is a flow diagram of a process for verifying a circuit design according to a further embodiment of the present invention.

Illustrated in FIG. 12 is another embodiment of the invention. In this embodiment, in addition to the steps discussed with respect to FIG. 3, the circuit design is partitioned at step 1204. In one embodiment, partitioning is done at the granularity of modules. In another embodiment, partitioning is done at the granularity of module instances. Further details regarding partitioning of circuit designs is disclosed in co-pending U.S. application Ser. No. 10/422,535, filed on Apr. 23, 2003, which was previously incorporated by reference in its entirety.

Figure 13A:
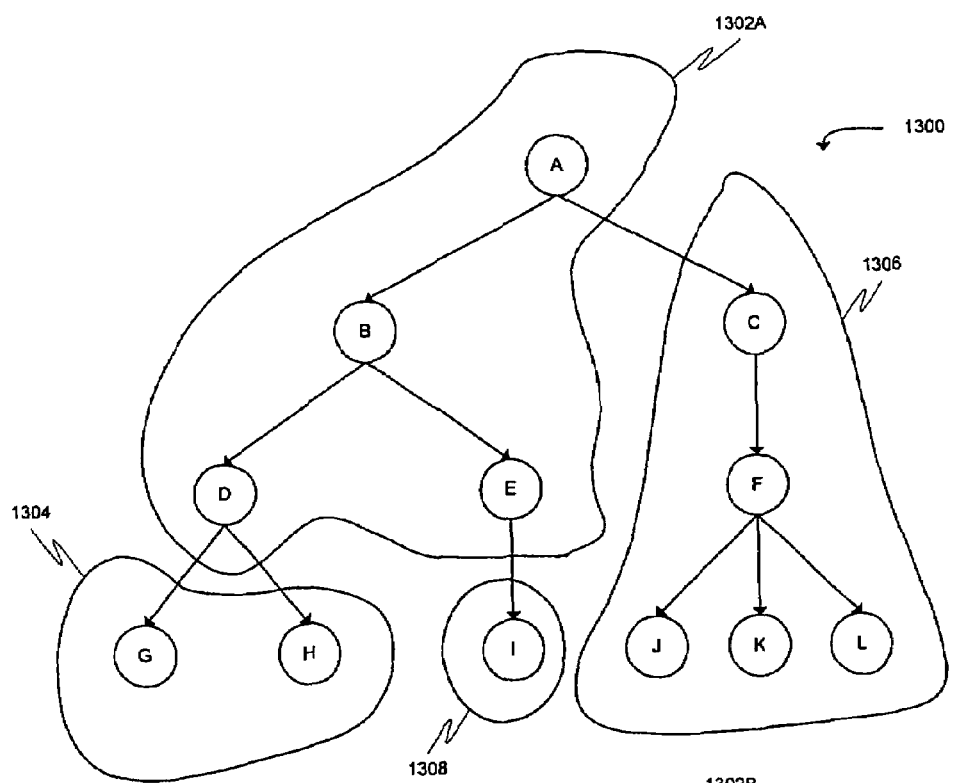
FIGS. 13A-13B illustrate a design hierarchy tree according to an embodiment of the present invention.

In an embodiment, the isolated portion of the circuit design comprises one or more module instances. In one embodiment, the isolated portion of the circuit design comprises at least one partition. For example, in FIG. 13A, a design hierarchy tree 1300 is illustrated. In the embodiment, design hierarchy tree 1300 is partitioned into four pieces 1302-1308. If the selected requirement to be verified is in module instance B, then partition 1302 is isolated. In this embodiment, partition 1302 is also the isolated portion of the circuit design. Isolated portion 1302A contains four module instances. In one embodiment, once an assertion has been verified in one instance of a module, the assertion is not verified again in other instances of the same module.

A time limit for verification of requirements is specified at step 1210. At step 1216, a determination is made as to whether the time limit has expired. If the time limit has expired, the process terminates. If time limit has not expired, a determination is made as to whether verification of the selected requirement resulted in an error (1218). If the selected requirement has been verified, the process ends. If the selected requirement has not been verified, the partition is expanded at step 1220 and the process returns to step 1214 to re-run verification of the selected requirement on the expanded partition.

Figure 13B:
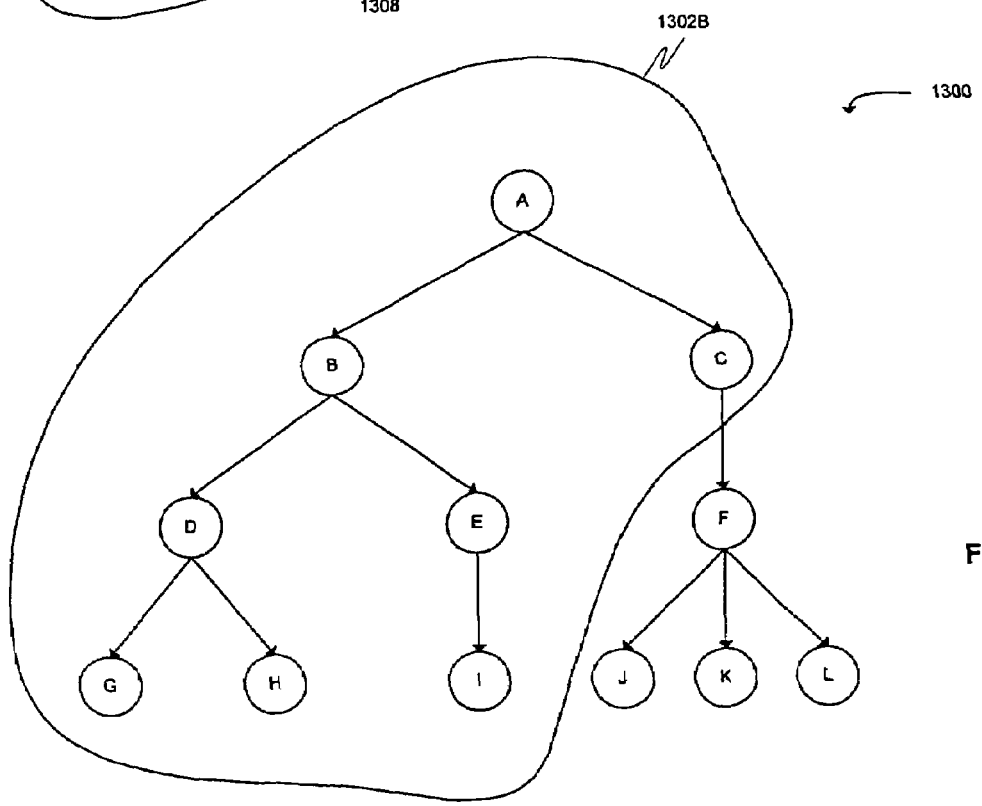

FIG. 13B illustrates the size of isolated portion 1302 after expansion. In the embodiment, expansion of the isolated portion 1302 is based on a metric distance. Originally, isolated portion 1302A contained only four module instances. After expansion, isolated portion 1302B contains eight module instances. In another embodiment, the metric distance may be based on the hierarchy in design hierarchy tree 1300 rather than the number of module instances. In a further embodiment, expansion of a partition may be based on data dependencies rather than on a metric distance.

As described above, assertion propagation is done independent of partitioning. Assertions are propagated as far as they can go, leaving copies behind to be assumed or checked at various levels in the hierarchy. No matter where the partitioning algorithm draws its boundaries, any assertions that need to be checked or can be assumed in a given partition will already be there.

One alternative is to partition first, and then propagate assertions only to the boundaries of the partitions that are created. This could potentially reduce the number of assertion copies created. In another embodiment, the number of assertions present at the interface to a module may be used as a factor in partitioning. Interface assertions act as environment constraints, either modeling the outer environment (input constraints) or the inner environment (output constraints). In a further embodiment, partitioning decisions may be based on the results of assertion propagation as a module boundary that is "well-constrained" may be a better partition boundary than one without constraints.

Figure 14:
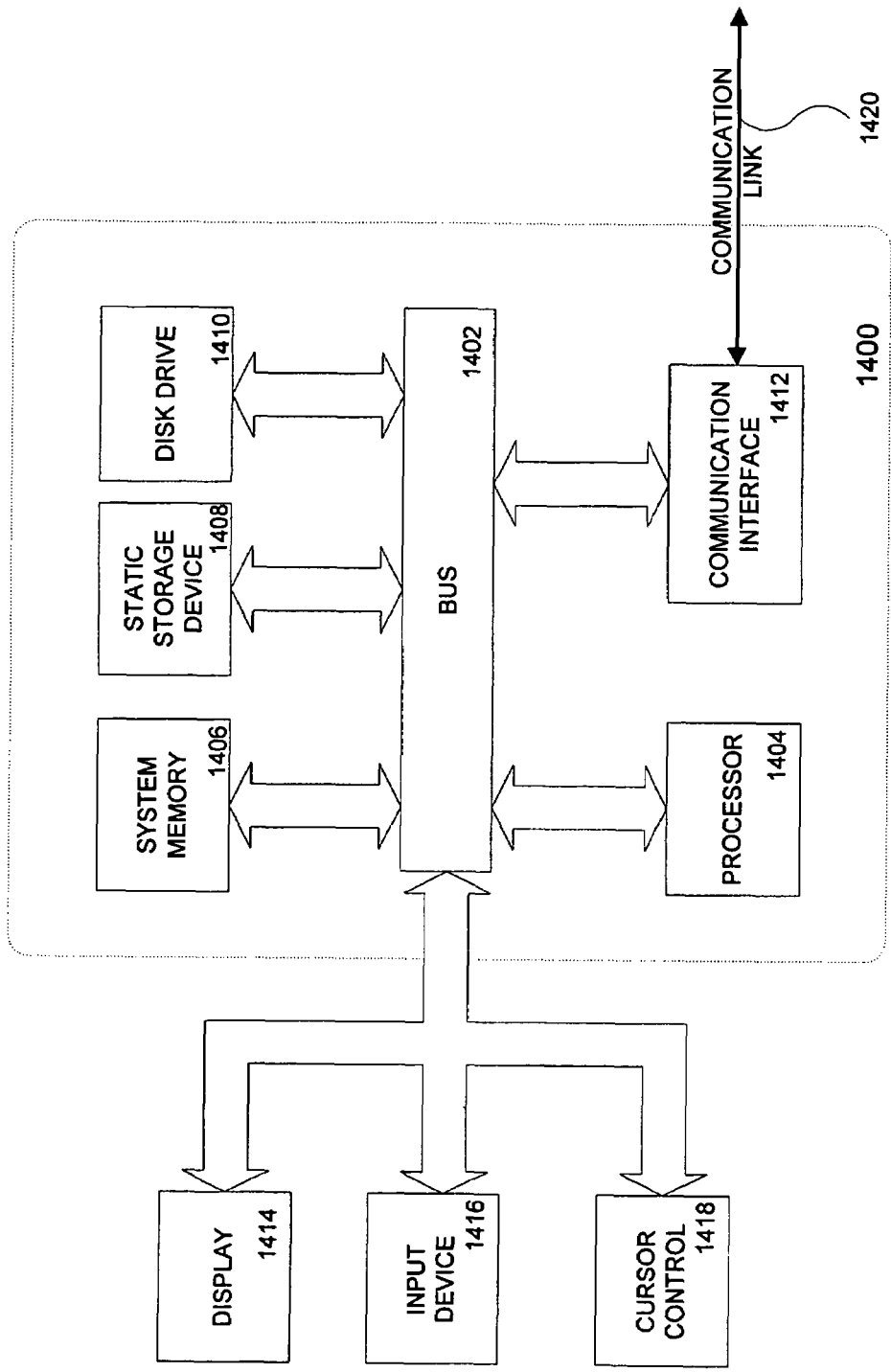
FIG. 14 is a diagram of a computer hardware system with which the present invention can be implemented.

FIG. 14 is a block diagram of a computer system 1400 suitable for implementing an embodiment of the present invention. Computer system 1400 includes a bus 1402 or other communication mechanism for communicating information, which interconnects subsystems and devices, such as processor 1404, system memory 1406 (e.g., RAM), static storage device 1408 (e.g., ROM), disk drive 1410 (e.g., magnetic or optical), communication interface 1412 (e.g., modem or ethernet card), display 1414 (e.g., CRT or LCD), input device 1416 (e.g., keyboard), and cursor control 1418 (e.g., mouse or trackball).

According to one embodiment of the invention, computer system 1400 performs specific operations by processor 1404 executing one or more sequences of one or more instructions contained in system memory 1406. Such instructions may be read into system memory 1406 from another computer readable medium, such as static storage device 1408 or disk drive 1410. In alternative embodiments, hard-wired circuitry may be used in place of or in combination with software instructions to implement the invention.

The term "computer readable medium" as used herein refers to any medium that participates in providing instructions to processor 1404 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1406.

Common forms of computer readable media includes, for example, floppy disk, flexible disk, hard disk, magnetic tape, any other magnetic medium, CD-ROM, any other optical medium, punch cards, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1400 coupled by communication link 1420 (e.g., LAN, PTSN, or wireless network) may perform the sequence of instructions required to practice the invention in coordination with one another.

Computer system 1400 may transmit and receive messages, data, and instructions, including program, i.e., application code, through communication link 1420 and communication interface 1412. Received program code may be executed by processor 1404 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. Additionally, although presently capacity is not an issue for simulation of designs, it is foreseeable that in the future circuit designs may be of a size that cannot be handled by a simulator as a whole. Thus, the method and system for verifying integrated circuit designs through propagation disclosed herein may be applicable to simulation. The specification and drawings are, accordingly, to be regarded in an illustrative rather than restrictive sense.

The invention claimed is:

1. A computer implemented method for verifying a circuit design comprising:

propagating a plurality of provided assertions as one or more groups of related assertions within a circuit design;

classifying one assertion in each of the one or more groups of related assertions as a first requirement for verifying the circuit design, in which two assertions are related if the two assertions are propagated from a same provided assertion or one of the two assertions is propagated from the other of the two assertions;

selecting a requirement from the first requirement of each of the one or more groups of related assertions to verify;

isolating a portion of the circuit design containing the selected requirement;

avoiding circular reasoning, in which an assumption is directly or indirectly used to prove itself;

verifying the selected requirement in the isolated portion of the circuit design using one or more of the plurality of provided assertions not selected as the selected requirement in the isolated portion of the circuit design as one or more assumptions; and storing a result of the act of verifying the selected requirement in the isolated portion of the circuit design in a computer readable medium.

2. The method of claim 1 wherein propagating the plurality of provided assertions comprises:

building one or more equivalence classes for a plurality of signals;

generalizing each of the plurality of provided assertions by replacing a first reference to a signal with a second reference to a corresponding equivalence class in which the signal appears; and creating a reflected assertion for each unique pathname prefix in a common prefix set for one or more equivalence classes referenced by each generalized assertion.

3. The method of claim 1 wherein a provided assertion is not propagated through sequential logic.

4. The method of claim 1 wherein the circuit design does not contain a combinational cycle.

5. The method of claim 1 wherein avoiding circular reasoning comprises:
   determining a depth for each assertion in the circuit design; and
   discarding each assertion with a depth less than the depth of the selected requirement or greater than or equal to the depth of the requirement corresponding to the assertion.

6. The method of claim 1 wherein avoiding circular reasoning comprises:
   determining a depth for each assertion in the circuit design; and
   discarding each assertion with a depth greater than the depth of the selected requirement or less than or equal to the depth of the requirement corresponding to the assertion.

7. The method of claim 1 further comprising expanding the isolated portion of the circuit design when verification of the selected requirement results in an error.

8. The method of claim 1 further comprising:
   specifying a time limit for verification of the selected requirement; and
   terminating verification of the selected requirement when the time limit expires.

9. The method of claim 1 wherein the circuit design comprises one or more modules, each module being instantiated one or more times.

10. The method of claim 9 wherein the isolated portion of the circuit design comprises one or more module instances.

11. The method of claim 9 wherein once an assertion has been verified in an instance of a module, the assertion is not verified again in other instances of the same module.

12. The method of claim 1 further comprising merging identical assertions in the isolated portion of the circuit design into one assertion.

13. The method of claim 1 further comprising resolving one or more conflicts among propagated assertions.

14. The method of claim 1 further comprising partitioning the circuit design, wherein the isolated portion of the circuit design comprises at least one partition.

15. A system for verifying a circuit design comprising:
   means for propagating a plurality of provided assertions as one or more groups of related assertions within a circuit design;
   means for classifying one assertion in each of the one or more groups of related assertions as a first requirement for verifying the circuit design, in which two assertions are related if the two assertions are propagated from a same provided assertion or one of the two assertions is propagated from the other of the two assertions;
   means for selecting a requirement from the first requirement of each of the one or more groups of related assertions to verify;
   means for isolating a portion of the circuit design containing the selected requirement;
   means for avoiding circular reasoning, in which an assumption is directly or indirectly used to prove itself;
   means for verifying the selected requirement in the isolated portion of the circuit design using one or more of the plurality of provided assertions not selected as the selected requirement in the isolated portion of the circuit design as one or more assumptions; and
   means for storing a result of the act of verifying the selected requirement in the isolated portion of the circuit design in a computer readable medium.

16. The system of claim 15 wherein means for propagating the plurality of provided assertions comprises:
   means for building one or more equivalence classes for a plurality of signals;
   means for generalizing each of the plurality of provided assertions by replacing a first reference to a signal with a second reference to a corresponding equivalence class in which the signal appears; and
   means for creating a reflected assertion for each unique pathname prefix in a common prefix set for one or more equivalence classes referenced by each generalized assertion.

17. The system of claim 15 wherein means for avoiding circular reasoning comprises:
   means for determining a depth for each assertion in the circuit design; and
   means for discarding each assertion with a depth less than the depth of the selected requirement or greater than or equal to the depth of the requirement corresponding to the assertion.

18. The system of claim 15 wherein means for avoiding circular reasoning comprises:
   means for determining a depth for each assertion in the circuit design; and
   means for discarding each assertion with a depth greater than the depth of the selected requirement or less than or equal to the depth of the requirement corresponding to the assertion.

19. The system of claim 15 further comprising means for expanding the isolated portion of the circuit design when verification of the selected requirement results in an error.

20. The system of claim 15 further comprising:
   means for specifying a time limit for verification of the selected requirement; and
   means for terminating verification of the selected requirement when the time limit expires.

21. The system of claim 15 wherein the circuit design comprises one or more modules, each module being instantiated one or more times.

22. The system of claim 21 wherein the isolated portion of the circuit design comprises one or more module instances.

23. The system of claim 21 wherein once an assertion has been verified in an instance of a module, the assertion is not verified again in other instances of the same module.

24. The system of claim 15 further comprising means for merging identical assertions in the isolated portion of the circuit design into one assertion.

25. The system of claim 15 further comprising means for resolving one or more conflicts among propagated assertions.

26. The system of claim 15 further comprising means for partitioning the circuit design, wherein the isolated portion of the circuit design comprises at least one partition.

27. A computer implemented method for verifying a circuit design comprising:
   propagating a plurality of provided assertions as one or more groups of related assertions within a circuit design; and
   verifying the circuit design using at least one of the propagated assertions as an assumption, wherein the act of verifying the circuit design comprises:
      classifying one assertion in each of the one or more groups of related assertions as a first requirement for verifying the circuit design, in which two assertions are related if the two assertions are propagated from a same provided assertion or one of the two assertions is propagated from the other of the two assertions;

selecting a requirement from the first requirement of each of the one or more groups of related assertions to verify;

isolating a portion of the circuit design containing the selected requirement;

verifying the selected requirement in the isolated portion of the circuit design using one or more of the plurality of provided assertions not selected as the selected requirement in the isolated portion of the circuit design as one or more assumptions; and storing a result of the act of verifying the selected requirement in the isolated portion of the circuit design in a computer readable medium.

28. The method of claim 27 wherein verifying the circuit design further comprises avoiding circular reasoning, in which the assumption or at least one of the one or more assumptions is directly or indirectly used to prove itself.

29. The method of claim 28 wherein avoiding circular reasoning comprises:

determining a depth for each assertion in the circuit design; and discarding each assertion with a depth less than the depth of the selected requirement or greater than or equal to the depth of the requirement corresponding to the assertion.

30. The method of claim 28 wherein avoiding circular reasoning comprises:

determining a depth for each assertion in the circuit design; and discarding each assertion with a depth greater than the depth of the selected requirement or less than or equal to the depth of the requirement corresponding to the assertion.

31. The method of claim 27 wherein verifying the circuit design further comprises expanding the isolated portion of the circuit design when verification of the selected requirement results in an error.

32. The method of claim 31 wherein the isolated portion of the circuit design is expanded based on a metric distance.

33. The method of claim 27 wherein verifying the circuit design further comprises:

specifying a time limit for verification of the selected requirement; and terminating verification of the selected requirement when the time limit expires.

34. The method of claim 27 wherein the circuit design comprises one or more modules, each module being instantiated one or more times.

35. The method of claim 34 wherein the isolated portion of the circuit design comprises one or more module instances.

36. The method of claim 34 wherein once an assertion has been verified in an instance of a module, the assertion is not verified again in other instances of the same module.

37. The method of claim 27 wherein verifying the circuit design further comprises merging identical assertions in the isolated portion of the circuit design into one assertion.

38. The method of claim 27 wherein verifying the circuit design further comprises resolving one or more conflicts among propagated assertions.

39. The method of claim 27 wherein verifying the circuit design further comprises partitioning the circuit design, wherein the isolated portion of the circuit design comprises at least one partition.

40. A system for verifying a circuit design, comprising:

means for propagating a plurality of provided assertions as one or more groups of related assertions within a circuit design; and means for verifying the circuit design using at least one of the propagated assertions as an assumption, wherein the means for verifying the circuit design comprises:

means for classifying one assertion in each of the one or more groups of related assertions as a first requirement for verifying the circuit design, in which two assertions are related if the two assertions are propagated from a same provided assertion or one of the two assertions is propagated from the other of the two assertions;

means for selecting a requirement from the first requirement of each of the one or more groups of related assertions to verify;

means for isolating a portion of the circuit design containing the selected requirement;

means for verifying the selected requirement in the isolated portion of the circuit design using one or more of the plurality of provided assertions not selected as the selected requirement in the isolated portion of the circuit design as one or more assumptions; and means for storing a result of the act of verifying the selected requirement in the isolated portion of the circuit design in a computer readable medium.

41. The system of claim 40 wherein means for verifying the circuit design further comprises means for avoiding circular reasoning, in which the assumption or at least one of the one or more assumptions is directly or indirectly used to prove itself.

42. The system of claim 41 wherein means for avoiding circular reasoning comprises:

means for determining a depth for each assertion in the circuit design; and means for discarding each assertion with a depth less than the depth of the selected requirement or greater than or equal to the depth of the requirement corresponding to the assertion.

43. The system of claim 41 wherein means for avoiding circular reasoning comprises:

means for determining a depth for each assertion in the circuit design; and means for discarding each assertion with a depth greater than the depth of the selected requirement or less than or equal to the depth of the requirement corresponding to the assertion.

44. The system of claim 40 wherein means for verifying the circuit design further comprises means for expanding the isolated portion of the circuit design when verification of the selected requirement results in an error.

45. The system of claim 40 wherein means for verifying the circuit design further comprises:

means for specifying a time limit for verification of the selected requirement; and means for terminating verification of the selected requirement when the time limit expires.

46. The system of claim 40 wherein the circuit design comprises one or more modules, each module being instantiated one or more times.

47. The system of claim 46 wherein the isolated portion of the circuit design comprises one or more module instances.

48. The system of claim 46 wherein once an assertion has been verified in an instance of a module, the assertion is not verified again in other instances of the same module.

49. The system of claim 40 wherein means for verifying the circuit design further comprises means for merging identical assertions in the isolated portion of the circuit design into one assertion.

50. The system of claim 40 wherein means for verifying the circuit design further comprises means for resolving one or more conflicts among propagated assertions.

51. The system of claim 40 wherein means for verifying the circuit design further comprises means for partitioning the circuit design, wherein the isolated portion of the circuit design comprises at least one partition.

52. A computer program product comprising a computer readable medium having executable code to execute a process for verifying a circuit design, the process comprising:
propagating a plurality of provided assertions as one or more groups of related assertions within a circuit design;
classifying one assertion in each of the one or more groups of related assertions as a first requirement for verifying the circuit design, in which two assertions are related if the two assertions are propagated from a same provided assertion or one of the two assertions is propagated from the other of the two assertions;
selecting a requirement from the first requirement of each of the one or more groups of related assertions to verify;
isolating a portion of the circuit design containing the selected requirement;
avoiding circular reasoning, in which an assumption is directly or indirectly used to prove itself;
verifying the selected requirement in the isolated portion of the circuit design using one or more of the plurality of provided assertions not selected as the selected requirement in the isolated portion of the circuit design as one or more assumptions; and
storing a result of the act of verifying the selected requirement in the isolated portion of the circuit design in a computer readable medium.

53. A computer program product comprising a computer readable medium having executable code to execute a process for verifying a circuit design, the process comprising:
propagating a plurality of provided assertions as one or more groups of related assertions within a circuit design; and
verifying the circuit design using at least one of the propagated assertions as an assumption, wherein the act of verifying the circuit design comprises:
classifying one assertion in each of the one or more groups of related assertions as a first requirement for verifying the circuit design, in which two assertions are related if the two assertions are propagated from a same provided assertion or one of the two assertions is propagated from the other of the two assertions;
selecting a requirement from the first requirement of each of the one or more groups of related assertions to verify;
isolating a portion of the circuit design containing the selected requirement;
verifying the selected requirement in the isolated portion of the circuit design using one or more of the plurality of provided assertions not selected as the selected requirement in the isolated portion of the circuit design as one or more assumptions; and
storing a result of the verifying act and the circuit design after the verifying the selected requirement in a computer readable medium for use in electronic circuit design or manufacturing.

* * * * *